United States Patent
Park et al.

(10) Patent No.: US 10,678,716 B2
(45) Date of Patent: Jun. 9, 2020

(54) MEMORY DEVICE AND MEMORY SYSTEM INCLUDING THE SAME

(71) Applicant: SK hynix Inc., Gyeonggi-do (KR)

(72) Inventors: Myeong-Jae Park, Gyeonggi-do (KR); Seok-Woo Choi, Gyeonggi-do (KR); Young-Jae Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/234,895

(22) Filed: Dec. 28, 2018

(65) Prior Publication Data

US 2019/0294566 A1    Sep. 26, 2019

(30) Foreign Application Priority Data

Mar. 26, 2018 (KR) .......... 10-2018-0034369

(51) Int. Cl.
| | | |
|---|---|---|
| G06F 13/16 | (2006.01) | |
| H01L 25/18 | (2006.01) | |
| H01L 25/065 | (2006.01) | |
| G06F 13/28 | (2006.01) | |

(52) U.S. Cl.
CPC ......... *G06F 13/1668* (2013.01); *G06F 13/28* (2013.01); *H01L 25/0657* (2013.01); *H01L 25/18* (2013.01); *H01L 2225/06513* (2013.01); *H01L 2225/06517* (2013.01); *H01L 2225/06541* (2013.01); *H01L 2225/06565* (2013.01); *H01L 2225/06586* (2013.01)

(58) Field of Classification Search
CPC . G06F 13/1668; G06F 13/28; H01L 25/0657; H01L 25/18; H01L 2225/06513; H01L 2225/06517; H01L 2225/06541; H01L 2225/06565; H01L 2225/06586
See application file for complete search history.

(56) References Cited

U.S. PATENT DOCUMENTS

| | | | | |
|---|---|---|---|---|
| 8,356,214 | B2 | 1/2013 | Do | |
| 2003/0110344 | A1* | 6/2003 | Szczepanek | ...... H04L 12/40013 711/100 |
| 2010/0162037 | A1* | 6/2010 | Maule | .................. G06F 11/106 714/5.11 |
| 2015/0255131 | A1* | 9/2015 | Byeon | ..................... G11C 5/04 365/230.03 |

FOREIGN PATENT DOCUMENTS

KR   1020160034913   3/2016

* cited by examiner

*Primary Examiner* — Henry Tsai
*Assistant Examiner* — John B Roche
(74) *Attorney, Agent, or Firm* — IP & T Group LLP

(57) ABSTRACT

A memory device includes: a plurality of first control signal interfaces respectively corresponding to a plurality of channels, and suitable for receiving control signals from a host; a plurality of first data interfaces respectively corresponding to the plurality of channels, and suitable for exchanging data and data strobe signals with the host; a second control signal interface suitable for receiving control signals through a selected one of the first control signal interfaces and a selected one of the channels and outputting the received control signals, in a monitoring mode; and a second data interface suitable for receiving a part of the data and data strobe signals exchanged through a selected one of the first data interfaces and the selected channel, and outputting the received part of the data and data strobe signals, in the monitoring mode.

16 Claims, 2 Drawing Sheets

MEMORY DEVICE AND MEMORY SYSTEM INCLUDING THE SAME

CROSS-REFERENCE TO RELATED APPLICATION

This application claims priority under 35 U.S.C. § 119 to Korean Patent Application No. 10-2018-0034369, filed on Mar. 26, 2018, which is incorporated herein by reference in its entirety.

BACKGROUND

1. Field

Various embodiments relate to a memory device and a memory system including the same.

2. Discussion of the Related Art

With the rapid development of the semiconductor memory technology, the packaging technology for a semiconductor device has gradually required high integration and high performance. Therefore, a variety of techniques for a three-dimensional (3D) structure have been developed in place of a two-dimensional (2D) structure. In accordance with the 2D structure, integrated circuit chips are two-dimensionally arranged on a printed circuit board (PCB) through wires or bumps. In accordance with the 3D structure, integrated circuit chips are vertically stacked.

Such a 3D structure may be implemented through a stacked memory device in which memory chips are vertically stacked. The memory chips stacked in the vertical direction are mounted on a substrate for a semiconductor package while being electrically coupled to each other through through-silicon vias (TSVs).

SUMMARY

Various embodiments are directed to a technology capable of monitoring an operation of a memory device.

In an embodiment, a memory device may include: a plurality of first control signal interfaces respectively corresponding to a plurality of channels, and suitable for receiving control signals from a host; a plurality of first data interfaces respectively corresponding to the plurality of channels, and suitable for exchanging data and data strobe signals with the host; a second control signal interface suitable for receiving control signals through a selected one of the first control signal interfaces and a selected one of the channels and outputting the received control signals, in a monitoring mode; and a second data interface suitable for receiving a part of the data and data strobe signals exchanged through a selected one of the first data interfaces and the selected channel, and outputting the received part of the data and data strobe signals, in the monitoring mode.

In an embodiment, a memory system may include: a memory device comprising a plurality of channels, a physical (PHY) interface and a direct access (DA) interface; a memory controller comprising a physical (PHY) interface suitable for transmitting control signals to the plurality of channels, and exchanging data through the plurality of channels; and an interposer suitable for transferring control signals and data between the memory controller and the memory device, wherein the PHY interface of the memory device is suitable for receiving the control signals transmitted from the memory controller and exchanging data with the memory controller; and the DA interface is suitable for receiving control signals through a selected one of the channels, among the control signals received through the PHY interface of the memory device, and receiving a part of the data through the selected channel among the data exchanged through the PHY interface of the memory device, and outputting the received control signals and the received part of the data, in a monitoring mode; and wherein the interposer transfers the control signals and data between the PHY interface of the memory controller and the PHY interface of the memory device.

In another embodiment, a memory device may include: a plurality of first control signal interfaces suitable for receiving control signals from a host; a plurality of first data interfaces respectively corresponding to the plurality of first control signal interfaces, and suitable for exchanging data and data strobe signals with the host; a second control signal interface suitable for receiving control signals through a selected one of the first control signal interfaces and outputting the received control signals, in a monitoring mode; and a second data interface suitable for receiving a part of the data and data strobe signals exchanged through a selected one of the first data interfaces, and outputting the received part of the data and data strobe signals, in the monitoring mode.

DETAILED DESCRIPTION

Figure 1:
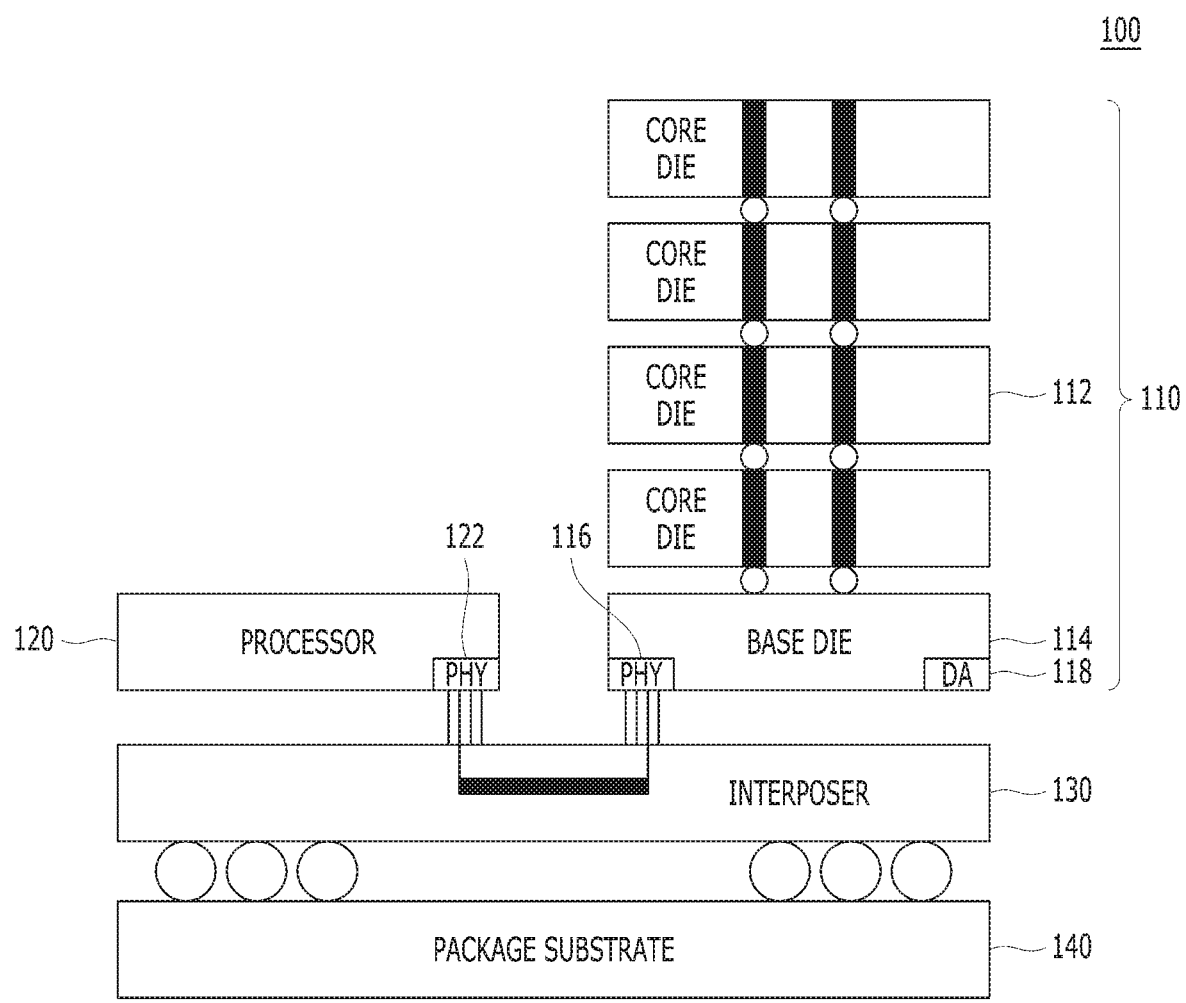
FIG. 1 illustrates the configuration of a memory system in accordance with an embodiment.

Various embodiments will be described below in more detail with reference to the accompanying drawings. The present invention may, however, be embodied in different forms and thus is not limited to the embodiments set forth herein. Rather, these embodiments are provided so that this disclosure is thorough and complete and fully conveys the scope of the present invention to those skilled in the art. Throughout the disclosure, like reference numerals refer to like parts throughout the various figures and embodiments of the present invention. Also, throughout the specification, reference to "an embodiment," "another embodiment," or the like is not necessarily to only one embodiment, and different references to any such phrase are not necessarily to the same embodiment(s).

FIG. 1 illustrates the configuration of a memory system 100 in accordance with an embodiment.

Referring to FIG. 1, the memory system 100 may include a memory device 110, a memory controller 120, an interposer 130 and a package substrate 140.

The interposer 130 may be formed over the package substrate 140. The memory device 110 and the memory controller 120 may be formed over the interposer 130. Since the memory controller 120 is generally included in various processors such as a central processing unit (CPU), graphic processing unit (GPU) and application processor (AP), the memory controller 120 is represented by PROCESSOR in FIG. 1. A physical (PHY) interface 116 of the memory device 110 and a physical (PHY) interface 122 of the memory controller 120 may be coupled through the interposer 130. The PHY interface 116 may serve as an interface for communication between the memory device 110 and the memory controller 120.

The memory device 110 may include a plurality of integrated circuit chips stacked therein. The integrated circuit chips may be electrically coupled to each other by through-silicon vias (TSVs). The plurality of integrated circuit chips may include a base die 114 and a plurality of core dies 112. Each of the core dies 112 may include a cell array for storing data and circuits for writing data to, and reading data from, the cell array. The base die 114 may include circuits for interfacing the core dies 112 and the base die 114 and circuits for interfacing the base die 114 and the memory controller 120. When the memory device 110 is configured in the above-described manner, the number of input/output units may be significantly increased, which makes it possible to increase a bandwidth. Examples of the memory device 110 having such a configuration may include a high bandwidth memory (HBM) adopted by Joint Electron Device Engineering Council (JEDEC) as an industry standard. The HBM may include various versions of HBMs such as HBM2 and HBM3 as well as HBM1.

The PHY interface 116 may serve as an interface for communication between the base die 114 and the memory controller 120. A direct access (DA) interface 118 may be serve as an interface for test of the memory device 110. The PHY interface 116 may be coupled to the interposer 130 through micro bumps. The micro bumps may have a very small physical size and the number of micro bumps exceeds 1,000. Thus, it is very difficult to test the memory device 110 using the PHY interface 116. Furthermore, since the memory device 110 communicates with the memory controller 120 in a package such as system-in-package (SIP), it is more difficult to test the memory device using the PHY interface 116. For this reason, the DA interface 118 interfaced through DA pads which have a larger physical size than the micro bumps and are fewer than the micro bumps may be used for a test of the memory device 110.

Figure 2:
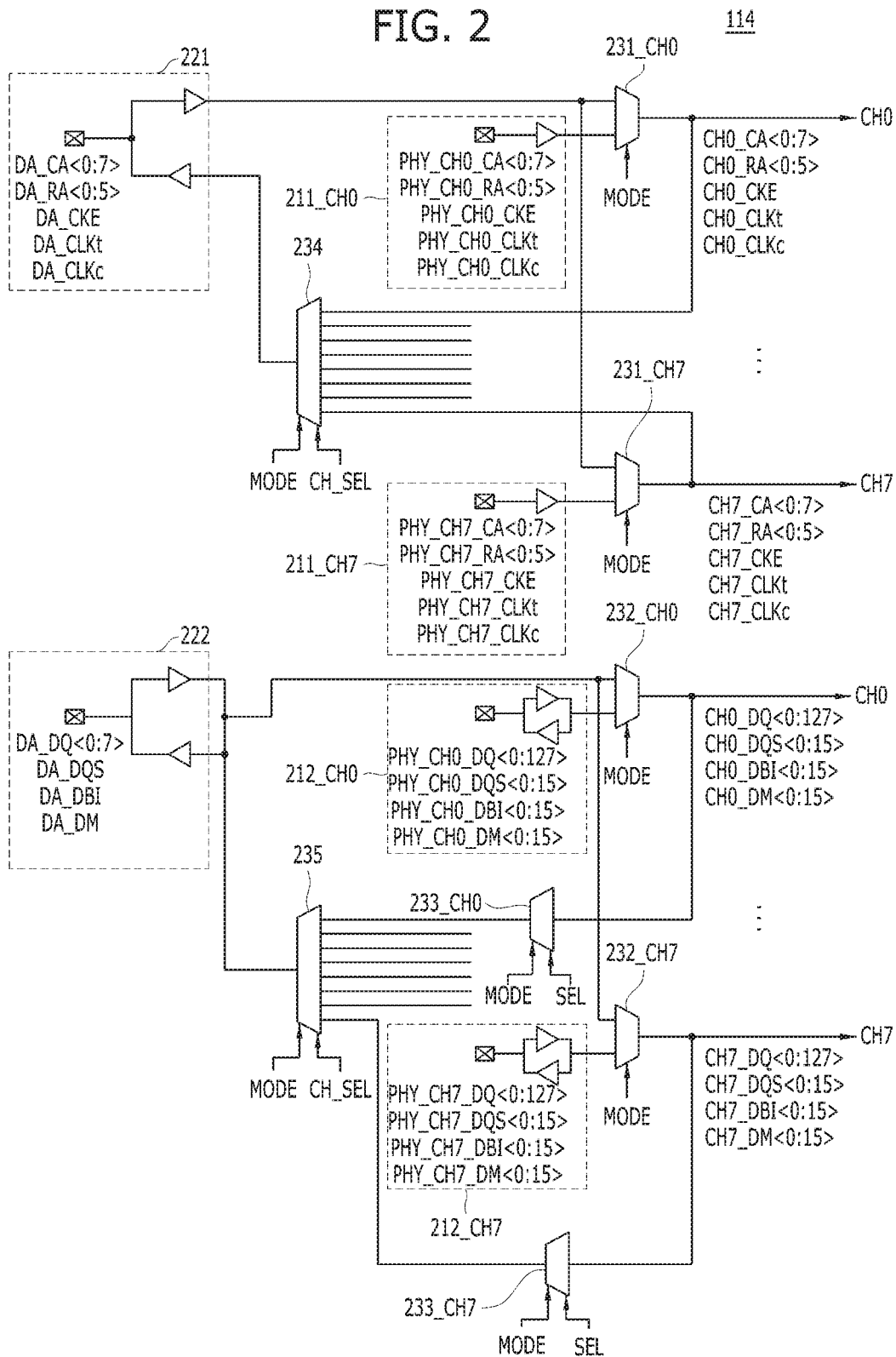
FIG. 2 illustrates components which are related to a PHY interface and a direct access (DA) interface in a base die of a memory device in accordance with an embodiment.

FIG. 2 illustrates a base die in accordance with an embodiment. For example, FIG. 2 illustrates components which are related to the PHY interface 116 and the DA interface 118 in the base die 114 of the memory device 110 in FIG. 1.

Referring to FIG. 2, the memory device 110 may include a plurality of channels CH0 to CH7. The channels CH0 to CH7 may be controlled by respective individual control signals and transmit and receive individual data. The channels CH0 to CH7 of the memory device 110 may perform different operations at the same time. For example, while a read operation is performed in the channel CH1, a write operation may be performed in the channel CH5, and an active operation may be performed in the channel CH6.

The PHY interface 116 may include a plurality of first control signal interfaces 211_CH0 to 211_CH7 and a plurality of first data interfaces 212_CH0 to 212_CH7. In various embodiments, the PHY interface 116 may be used in one of a mission mode and a monitoring mode.

The plurality of first control signal interfaces 211_CH0 to 211_CH7 may correspond to the respective channels CH0 to CH7, and receive control signals for the corresponding channels. For example, the first control signal interface 211_CH0 may receive the control signals PHY_CH0_CA<0:7>, PHY_CH0_RA<0:5>, PHY_CH0_CKE, PHY_CH0_CLKt and PHY_CH0_CLKc for the channel CH0. The first control signal interface 211_CH5 may receive the control signals PHY_CH5_CA<0:7>, PHY_CH5_RA<0:5>, PHY_CH5_CKE, PHY_CH5_CLKt and PHY_CH5_CLKc for the channel CH5.

Each of the first control signal interfaces 211_CH0 to 211_CH7 may include a plurality of micro bumps and receivers for receiving control signals. For example, the first control signal interface 211_CH3 may include 17 micro bumps and 17 receivers for receiving 17 control signals PHY_CH3_CA<0:7>, PHY_CH3_RA<0:5>, PHY_CH3_CKE, PHY_CH3_CLKt and PHY_CH3_CLKc. For clarity, FIG. 2 illustrates that each of the first control signal interfaces includes only one micro bump and one receiver. The control signals are defined as follows: PHY_CHN_CA<0:7> represents eight signals including a column command and column address, PHY_CHN_RA<0:5> represents six signals including a row command and row address, PHY_CHN_CKE represents a clock enable signal, and PHY_CHN_CLKt and PHY_CHN_CLKc represents clock signals which are inputted in a differential manner, where N is an integer from 0 to 7 inclusive.

The plurality of first data interfaces 212_CH0 to 212_CH7 may correspond to the respective channels CH0 to CH7, and receive data and data-related signals for the corresponding channels. For example, the first data interface 212_CH1 may transmit and receive data PHY_CH1_DQ<0:127>, data strobe signals PHY_CH1_DQS<0:15>, data bus inversion signals PHY_CH1_DBI<0:15> and data mask signals PHY_CH1_DM<0:15> for the channel CH1. The first data interface 212_CH7 may transmit and receive data PHY_CH7_DQ<0:127>, data strobe signals PHY_CH7_DQS<0:15>, data bus inversion signals PHY_CH7_DBI<0:15> and data mask signals PHY_CH7_DM<0:15> for the channel CH7.

Each of the first data interfaces 212_CH0 to 212_CH7 may include a plurality of micro bumps and receivers for receiving the data and data-related signals. For example, the first data interface 212_CH6 may include 176 micro bumps, 176 receivers and 176 transmitters. The 176 micro bumps may include 128 micro bumps for DQ (i.e., data), 16 micro bumps for DQS (i.e., data strobe signals), 16 micro bumps for DBI (i.e., data bus inversion signals) and 16 micro bumps for DM (i.e., data mask signals). For clarity, FIG. 2 illustrates that each of the first data interfaces includes only one micro bump, one receiver and one transmitter.

The DA interface 118 may include a second control signal interface 221 and a second data interface 222. In various embodiments, the DA interface 118 may be used in one of a direct access (DA) mode and the monitoring mode.

In the DA mode, the second control signal interface 221 may receive control signals DA_CA<0:7>, DA_RA<0:5>, DA_CKE, DA_CLKt and DA_CLKc. In the monitoring mode, the second control signal interface 221 may receive control signals for a selected channel among the channels CH0 to CH7, and output the received control signals. In various embodiments, the second control signal interface 221 may include 17 DA pads, 17 receivers and 17 transmitters. For clarity, FIG. 2 illustrates that the second control signal interface 221 includes only one DA pad, one receiver and one transmitter.

In the DA mode, the second data interface 222 may transmit and receive data DA_DQ<0:7> and data-related signals DA_DQS, DA_DBI and DA_DM. In the monitoring mode, the second data interface 222 may receive a part of data and data-related signals for a selected channel among the channels CH0 and CH7, and output the received data and data-related signals.

The selection circuits 231_CH0 to 231_CH7 may select the control signals received through the first control signal interfaces 211_CH0 to 211_CH7 for the corresponding channels or the control signals received through the second control signal interface 221, in response to a mode signal MODE. The control signals selected by the selection circuits 231_CH0 to 231_CH7 may serve as control signals for controlling the corresponding channels. For example, the control signals for controlling the channel CH3 may include the control signals CH3_CA<0:7>, CH3_RA<0:5>, CH3_CKE, CH3_CLKt and CH3_CLKc selected by the selection circuit 231_CH3. The mode signal MODE may include a multi-bit signal, and include information indicating an operation mode of the memory device 110. For example, the mode signal MODE may indicate one operation mode among the mission mode, the DA mode and the monitoring mode. The selection circuits 231_CH0 to 231_CH7 may select the control signals received through the first control signal interfaces 211_CH0 to 211_CH7 in the mission mode and the monitoring mode, and select the control signals received through the second control signal interface 221 in the DA mode.

The selection circuits 232_CH0 to 232_CH7 may select the data and data-related signals received through the first data interfaces 212_CH0 to 212_CH7 for the corresponding channels or select the data and data-related signals received through the second data interface 222, in response to the mode signal MODE. The data and data-related signals selected by the selection circuits 232_CH0 to 232_CH7 may correspond to the data and data-related signals received through the corresponding channels. For example, the data and data-related signals received through the channel CH2 may correspond to the data CH2_DQ<0:127> and data-related signals CH2_DQS<0:15>, CH2_DBI<0:15> and CH2_DM<0:15> selected by the selection circuit 232_CH2. The selection circuits 232_CH0 to 232_CH7 may select the data and data-related signals from the first data interfaces 212_CH0 to 212_CH7 in the mission mode and the monitoring mode, and select the data and data-related signals from the second data interface 222 in the DA mode.

The second data interface 222 may transmit and receive only a part (e.g., 1/16) of the data and data-related signals which are transmitted and received through the first data interfaces 212_CH0 to 212_CH7. Therefore, when the data DA_DQ<0:7> and data-related signals DA_DQS, DA_DBI and DA_DM received from the second data interface 222 are selected by the select circuits 232_CH0 to 232_CH7, the data DA_DQ<0:7> and data-related signals DA_DQS, DA_DBI and DA_DM may be copied 16 times and transferred to the channels CH0 to CH7. For example, the selection circuit 232_CH7 may copy the data DA_DQ<0:7>16 times and transfer the copied data as the data CH7_DQ<0:127> in the DA mode. Thus, the operation of the selection circuit 232_CH7 may be expressed as: DA_DQ<0:7>=CH7_DQ<0:7>, DA_DQ<0:7>=CH7_DQ<8:15>, . . . DA_DQ<0:7>=CH7_DQ<120:127>). Furthermore, the selection circuit 232_CH7 may copy the data-related signals DA_DQS, DA_DBI and DA_DM 16 times, and transfer the copied signals as the data-related signals CH7_DQS<0:15>, CH7_DBI<0:15> and CH7_DM<0:15>, respectively. Thus, the operation of the selection circuit 232_CH7 may be expressed as: DA_DQS=CH7_DQS<0:15>, DA_DBI=CH7_DBI<0:15> and DA_DM=CH7_DM<0:15>.

The selection circuits 233_CH0 to 233_CH7 may select signals to output through the second data interface 222, among the data and data-related signals of the corresponding channels, in response to the mode signal MODE and the select signal SEL. The selection circuits 233_CH0 to 233_CH7 may be enabled in the DA mode and the monitoring mode. When the selection circuits 233_CH0 to 233_CH7 are enabled, the selection circuits 233_CH0 to 233_CH7 may select eight data of the 128 data (i.e., DQ), one of the 16 data strobe signals (i.e., DQS), one of the 16 data bus inversion signals (i.e., DBI) and one of the 16 data mask signals (i.e., DM) in the corresponding channels, in response to the select signal SEL. In various embodiments, the select signal SEL may include a multi-bit signal, and include information indicating which signals the selection circuits 233_CH0 to 233_CH7 need to select.

The selection circuit 234 may select the control signals of one channel among the channels CH0 to CH7 in response to the mode signal MODE and the channel select signal CH_SEL, and transfer the selected control signals to the second control signal interface 221. The selection circuit 234 may be enabled in the monitoring mode. When the selection circuit 234 is enabled, the selection circuit 234 may select the control signals of the channel selected by the channel select signal CH_SEL among the eight channels CH0 to CH7, and transfer the selected control signals to the second control signal interface 221. In various embodiments, the channel select signal CH_SEL may include a multi-bit signal, and include information indicating which channel to select among the channels CH0 to CH7.

The selection circuit 235 may select the data and data-related signals selected by the selection circuit of the selected channel among the selection circuits 233_CH0 to 233_CH7 in response to the mode signal MODE and the channel select signal CH_SEL, and transfer the selected data and data-related signals to the second data interface 222. The selection circuit 235 may be enabled in the DA mode and the monitoring mode. When the selection circuit 235 is enabled, the selection circuit 235 may select a channel designated by the channel select signal CH_SEL among the channels CH0 to CH7.

Now, the operations of the memory device 110 in the respective modes will be described.

Operation in Mission Mode.

The mission mode may indicate a normal mode in which the memory device 110 of FIG. 1 communicates with a host, i.e. the memory controller 120 using the PHY interface 116. During the mission mode, the selection circuits 231_CH0 to 231_CH7 of FIG. 2 may select the control signals received through the first control signal interfaces 211_CH0 to 211_CH7, and the selection circuits 232_CH0 to 232_CH7 may select the first data interfaces 212_CH0 to 212_CH7. Therefore, in the mission mode, the channels CH0 to CH7 of the memory device 110 may receive the control signals of the corresponding channels using the first control signal interfaces 211_CH0 to 211_CH7, and transmit and receive the data and data-related signals of the corresponding channels using the first data interfaces 212_CH0 to 212_CH7.

Operation in DA Mode.

The DA mode may indicate a test mode for testing the memory device 110 using the DA interface 118 of FIG. 1. During the DA mode, the selection circuits 231_CH0 to 231_CH7 of FIG. 2 may select the second control signal interface 221. Therefore, in the DA mode, the channels CH0 to CH7 of the memory device 110 may be controlled by the same control signals. During the DA mode, the selection circuits 232_CH0 to 232_CH7 may select a part of the data and data-related signals. Furthermore, the selection circuit 235 may transfer the data and data-related signals, which are selected by the selection circuit of the selected channel among the selection circuits 232_CH0 to 232_CH7, to the second data interface 222. Therefore, a part of the data and data-related signals of the selected channel among the channels CH0 to CH7 may be outputted through the second data interface 222.

Operation in Monitoring Mode.

The monitoring mode may indicate a mode for monitoring the control signals and the data and data-related signals of the PHY interface 116 using the DA interface 118 of FIG. 1, while the memory device 110 operates in the mission mode. During a mission mode operation of the memory device 110, various defects may occur. In this case, it is very difficult to correctly analyze the defects in the mission mode, using only the DA mode. In order to determine the types of the various defects in the mission mode and the situations in which the defects occur, it is important to monitor the control signals and the data and data-related signals which the memory device 110 directly transmits to and receives from the memory controller 120, using the PHY interface 116 in the mission mode. The monitoring mode may allow the monitoring operation.

In the monitoring mode, the selection circuit 234 of FIG. 2 may transfer the control signals received through the first control signal interface of the selected channel among the channels CH0 to CH7 to the second control signal interface 221. The second control signal interface 221 may output the received control signals from the selection circuit 234 to the DA pads. During the monitoring mode, the selection circuits 232_CH0 to 232_CH7 may select a part of the data and data-related signals. Furthermore, the selection circuit 235 may transfer the data and data-related signals, which are selected by the selection circuit of the selected channel among the selection circuits 232_CH0 to 232_CH7, to the second data interface 222. Therefore, a part of the data and data-related signals of the selected channel among the channels CH0 to CH7 may be outputted through the second data interface 222. That is, in the monitoring mode, the control signals which the selected channel among the channels CH0 to CH7 receives from the memory controller 120 may be outputted through the second control signal interface 221, and a part of the data and data-related signals which the selected channel transmits to and receives from the memory controller 120 may be outputted through the second data interface 222. Thus, it is possible to monitor which signals the memory device 110 transmits to and receives from the memory controller 120 through the PHY interface 116, using the signals outputted through the second control signal interface 221 and the second data interface 222.

When the monitoring mode is used, it is possible to easily analyze which error occurs in a certain situation during the mission mode operation of the memory device 110.

In accordance with embodiments, it is possible to effectively monitor the operation of the memory device.

Although various embodiments have been described and illustrated, it will be apparent to those skilled in the art that various changes and modifications may be made without departing from the spirit and scope of the invention as defined in the following claims.

What is claimed is:

1. A memory device comprising:
a plurality of first control signal interfaces respectively corresponding to a plurality of channels, and suitable for receiving control signals from a host;
a plurality of first data interfaces respectively corresponding to the plurality of channels, and suitable for exchanging data and data strobe signals with the host;
a second control signal interface suitable for receiving control signals through a selected one of the first control signal interfaces and a selected one of the channels and outputting the received control signals to an outside of the memory device, in a monitoring mode; and
a second data interface suitable for receiving a part of the data and data strobe signals exchanged through a selected one of the first data interfaces and the selected channel, and outputting the received part of the data and data strobe signals to the outside of the memory device, in the monitoring mode.

2. The memory device of claim 1, wherein the control signals received through the second control signal interface in a direct access (DA) mode are shared by the plurality of channels, and
the data and data strobe signal received through the second data interface in the DA access mode are shared by the plurality of channels.

3. The memory device of claim 1, wherein each of the first control signal interfaces and each of the first data interfaces comprises a plurality of micro bumps.

4. The memory device of claim 3, wherein each of the second control signal interface and the second data interface comprises a plurality of direct access (DA) pads, and
the second control signal interface outputs the received control signals to the outside of the memory device through the direct access pads.

5. The memory device of claim 4, wherein the memory device comprises a high bandwidth memory (HBM),
the plurality of first control signal interfaces and the plurality of first data interfaces are included in a physical (PHY) interface, and
the second control signal interface and the second data interface are included in a DA interface.

6. The memory device of claim 1, further comprising:
a first selection circuit suitable for selecting the control signals received through the selected first control signal interface, among the control signals received through the plurality of first control signal interfaces;
a plurality of second selection circuits respectively corresponding to the plurality of first data interfaces, and suitable for selecting a part of the data and data strobe signals exchanged through the first data interfaces, respectively; and
a third selection circuit suitable for selecting a selection result of the second selection circuit corresponding to the selected channel, among the plurality of second selection circuits.

7. The memory device of claim 1, wherein the plurality of first data interfaces further receive data mask signals and data bus inversion signals, and
the second data interface further receives, through the selected first data interface and the selected channel, a part of the data mask signals and the data bus inversion signals, and outputs the received part of the data mask signals and the data bus inversion signals.

8. A memory system comprising:
a memory device comprising a plurality of channels, a physical (PHY) interface and a direct access (DA) interface;
a memory controller comprising a physical (PHY) interface suitable for transmitting control signals to the plurality of channels, and exchanging data through the plurality of channels; and
an interposer suitable for transferring control signals and data between the memory controller and the memory device, wherein the PHY interface of the memory device is suitable for receiving the control signals transmitted from the memory controller and exchanging data with the memory controller; and the DA interface is suitable for receiving control signals through a selected one of the channels, among the control signals received through the PHY interface of the memory device, and receiving a part of the data through the selected channel among the data exchanged through the PHY interface of the memory device, and outputting the received control signals and the received part of the data to an outside of the memory device, in a monitoring mode; and wherein the interposer transfers the control signals and data between the PHY interface of the memory controller and the PHY interface of the memory device.

9. The memory system of claim 8, wherein the PHY interface of the memory device comprises:

a plurality of first control signal interfaces respectively corresponding to the plurality of channels, and suitable for receiving the control signals received from the memory controller; and a plurality of first data interfaces respectively corresponding to the plurality of channels, and suitable for exchanging data and data strobe signals with the memory controller.

10. The memory system of claim 9, wherein the DA interface of the memory device comprises:

a second control signal interface suitable for receiving control signals through selected first control signal interface and the selected channel, and outputting the received control signals to the outside of the memory device, in the monitoring mode; and a second data interface suitable for receiving a part of the data and data strobe signal exchanged through a selected one of the first data interfaces and the selected channel, and outputting the received part of the data and data strobe signals to the outside of the memory device, in the monitoring mode.

11. The memory device of claim 10, wherein the control signals received through the second control signal interface in a DA mode are shared by the plurality of channels, and the data and data strobe signals received through the second data interface in the DA access mode are shared by the plurality of channels.

12. The memory system of claim 10, wherein each of the first control signal interfaces and each of the first data interfaces comprises a plurality of micro bumps, each of the second control signal interface and the second data interface comprises a plurality of DA pads, and the second control signal interface outputs the received control signals to the outside of the memory device through the direct access pads.

13. The memory system of claim 10, wherein the memory device further comprises:

a first selection circuit suitable for selecting the control signals received through the selected first control signal interface, among the control signals received through the plurality of first control signal interfaces, and transferring the selected control signals to the second control signal interface;

a plurality of second selection circuits respectively corresponding to the first data interfaces, and suitable for selecting a part of the data and data strobe signals which are exchanged through the corresponding first data interfaces; and a third selection circuit suitable for selecting a selection result of the second selection circuit corresponding to the selected channel, among the plurality of second selection circuits, and transferring the selection result to the second data interface.

14. The memory system of claim 8, wherein the memory device comprises a high bandwidth memory (HBM).

15. The memory system of claim 8, wherein the memory controller is included in a processor.

16. A memory device comprising:

a plurality of first control signal interfaces suitable for receiving control signals from a host;

a plurality of first data interfaces respectively corresponding to the plurality of first control signal interfaces, and suitable for exchanging data and data strobe signals with the host;

a second control signal interface suitable for receiving control signals through a selected one of the first control signal interfaces and outputting the received control signals to an outside of the memory device, in a monitoring mode; and a second data interface suitable for receiving a part of the data and data strobe signals exchanged through a selected one of the first data interfaces, and outputting the received part of the data and data strobe signals, in the monitoring mode.

* * * * *